(12) United States Patent
Miyagawa et al.

(10) Patent No.: US 7,268,498 B2
(45) Date of Patent: Sep. 11, 2007

(54) DISPLAY DEVICE

(75) Inventors: Keisuke Miyagawa, Zama (JP); Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 129 days.

(21) Appl. No.: 11/113,133

(22) Filed: Apr. 25, 2005

(65) Prior Publication Data

US 2005/0242746 A1 Nov. 3, 2005

(30) Foreign Application Priority Data

Apr. 28, 2004 (JP) .............................. 2004-134723

(51) Int. Cl.
*G09G 3/10* (2006.01)
*G09G 3/30* (2006.01)

(52) U.S. Cl. ..................................... 315/169.3; 345/76

(58) Field of Classification Search ............. 315/169.3, 315/169.4; 345/76, 79, 82–84, 89, 92
See application file for complete search history.

(56) References Cited

U.S. PATENT DOCUMENTS

| 6,753,854 | B1 | 6/2004 | Koyama et al. | |
|---|---|---|---|---|
| 6,781,153 | B2 | 8/2004 | Anzai | |
| 6,784,454 | B2 | 8/2004 | Anzai | |
| 6,791,129 | B2* | 9/2004 | Inukai ........................ | 257/208 |
| 6,798,405 | B2 | 9/2004 | Anzai | |
| 2001/0002703 | A1* | 6/2001 | Koyama ...................... | 257/40 |
| 2002/0074580 | A1 | 6/2002 | Anzai et al. | |
| 2002/0075254 | A1 | 6/2002 | Anzai | |
| 2002/0084746 | A1 | 7/2002 | Anzai | |
| 2002/0101394 | A1 | 8/2002 | Anzai | |
| 2003/0090481 | A1 | 5/2003 | Kimura | |
| 2003/0132931 | A1* | 7/2003 | Kimura et al. .............. | 345/212 |
| 2003/0160745 | A1 | 8/2003 | Osame et al. | |
| 2004/0164303 | A1 | 8/2004 | Anzai | |
| 2004/0239231 | A1* | 12/2004 | Miyagawa et al. ......... | 313/438 |
| 2004/0252085 | A1 | 12/2004 | Miyagawa | |
| 2004/0263440 | A1 | 12/2004 | Kimura et al. | |
| 2005/0007181 | A1* | 1/2005 | Kimura ...................... | 327/524 |
| 2005/0190126 | A1* | 9/2005 | Kimura et al. ................ | 345/76 |

FOREIGN PATENT DOCUMENTS

| EP | 1 193 676 | 4/2002 |
|---|---|---|
| EP | 1 310 937 | 5/2003 |
| JP | 2002-175029 | 6/2002 |

* cited by examiner

*Primary Examiner*—Shih-Chao Chen
*Assistant Examiner*—Minh Dieu A
(74) *Attorney, Agent, or Firm*—Robinson Intellectual Property Law Office; Eric J. Robinson

(57) ABSTRACT

The inventors found out that in the case of performing a low gray scale display in which a very small amount of current is supplied to a light emitting element, variations in threshold voltages of driving transistors become notable since the gate-source voltage is low. In view of this, the invention provides a display device in which variations in the threshold voltages of the driving transistors are reduced even in the low gray scale display, and a driving method thereof. According to the invention, a gate-source voltage of the driving transistor is set higher in the low gray scale display than that in the high gray scale display. As one mode to achieve this, different power source lines are provided for the low gray scale display and the high gray scale display and their potentials are set to be different.

30 Claims, 12 Drawing Sheets

DISPLAY DEVICE

BACKGROUND OF THE INVENTION

1. Field of the Invention

The present invention relates to a display device having a self-light emitting element.

2. Description of the Related Art

In recent years, a display device using a light emitting element (self-light emitting element) has been actively researched and developed. Such a display device is widely used as a display of a portable phone or a monitor of a computer by taking advantages of high image quality, thin design, lightweight and the like. In particular, such a display device provides high response speed suitable for displaying moving images, low voltage, low power consumption drive and the like, therefore, its wide applications such as a new generation portable phone and a portable information terminal (PDA) are expected.

A light emitting element is also referred to as an organic light emitting diode (OLED) and has a structure having an anode, a cathode, and a layer containing an organic compound between the anode and the cathode. The amount of current supplied to the light emitting element and a luminescence of the light emitting element are in a certain relationship. The light emitting element emits light at a luminescence according to the amount of current supplied to the layer containing the organic compound.

The major methods for displaying a multi-gray scale image by a light emitting device using a light emitting element are a voltage input method and a current input method. According to the voltage input method, a video signal inputted to a pixel is inputted to a driving element, thereby a luminescence of the light emitting element is controlled. According to the current input method, a set signal current is supplied to a light emitting element, thereby a luminescence of the light emitting element is controlled. Both methods can employ an analog driving method (analog gray scale method) and a digital driving method (digital gray scale method).

In order to prevent variations in characteristics of element driving thin film transistors which correspond to driving elements of light emitting elements in the voltage input method, a semiconductor device provided with a compensating thin film transistor between a driving power source and the element driving thin film transistor has been suggested.

[Patent Document 1]
  Japanese Patent Laid-Open No. 2002-175029

In the aforementioned patent document, variations in the threshold voltage of transistors (referred to as driving transistors) which control driving current according to gray scales is not taken into consideration. However, the inventors figured out that in the case of performing a low gray scale display in which a minute current is supplied to the light emitting element, variations in threshold voltages (Vth) become notable since a gate-source voltage (Vgs) of the driving transistor, that is a potential difference between the gate electrode and the source electrode is small.

SUMMARY OF THE INVENTION

The invention provides a display device in which variations in threshold voltages (Vth) of driving transistors are reduced even in a low gray scale display, and a driving method thereof.

In view of the aforementioned, according to the invention, a gate-source voltage (Vgs) of a driving transistor is raised higher than the conventional one in the low gray scale display. As a result, effect of the variations in the threshold voltage (Vth) of driving transistors can be less even in the low gray scale display. As one mode of the invention, different power source lines are provided for the low gray scale display and a high gray scale display, of which potentials are determined to be different. By setting the potential of the power source line for the low gray scale display higher than that of the power source line for the high gray scale display, a gate-source voltage (Vgs) of a driving transistor can be set high.

In this case, a light emitting period (display period) is controlled for obtaining a predetermined low gray scale display. As one mode of the invention, the driving transistor and the power source line are disconnected. As one mode of such a pixel configuration, a switch is provided so that a current from the power source line is not supplied to the light emitting element.

According to one mode of the display device of the invention, a signal line to which an analog signal is inputted, a first transistor and a second transistor for driving a light emitting element, and a switch for disconnecting the second transistor and a power source line are provided. By using the first transistor based on the analog signal, a current is supplied from a first power source line to the light emitting element. By using the second transistor based on the analog signal, a current is supplied from a second power source line to the light emitting element, thus the switch is turned OFF per predetermined period, which is after the predetermined period passes. In other words, the second transistor and the light emitting element are disconnected by using the switch.

According to the invention, effect of variations in threshold voltages (Vth) of driving transistors can be suppressed in performing the low gray scale display. As a result, luminance variations of light emitting elements can be reduced.

By controlling the light emitting period using the switch in performing the low gray scale display, increase in luminance due to high gate-source voltage (Vgs) can be suppressed, thus a predetermined luminance can be obtained.

DETAILED DESCRIPTION OF THE INVENTION

Figure 1:
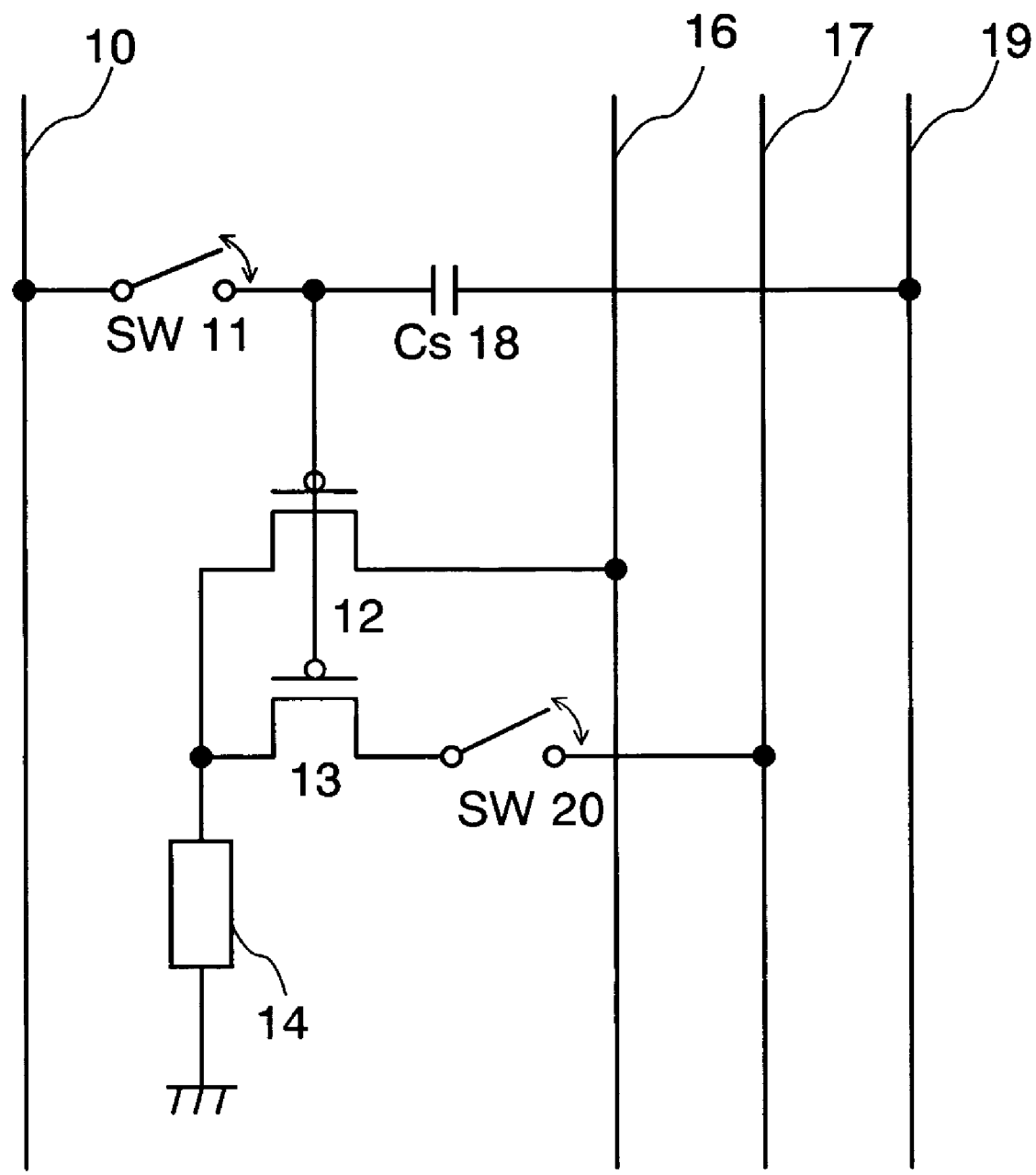
FIG. 1 is a diagram showing a pixel circuit of the invention.

Although the invention will be fully described by way of example with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals and detailed descriptions thereof are omitted.

In the following description, a transistor includes three electrodes: a gate, a source, and a drain, however, the source electrode and the drain electrode in particular cannot be clearly distinguished because of the structure of the transistor. Therefore, when describing connections between the elements, one of the source electrode and the drain electrode is referred to as a first electrode while the other is referred to as a second electrode.

EMBODIMENT MODE 1

In this embodiment mode, a pixel including a driving transistor for the high gray scale display and a driving transistor for the low gray scale display is described.

First, a pixel configuration is described with reference to FIG. 1. The pixel configuration of this embodiment mode includes a signal line 10 to which an analog signal is inputted, a write switch (SW11), a first driving transistor 12 for the high gray scale display, a second driving transistor 13 for the low gray scale display, and a light emitting element 14. The first driving transistor 12 and the second driving transistor 13 each has a function to drive the light emitting element 14. The first driving transistor 12 and the second driving transistor 13 are electrically connected to the light emitting element 14. A first power source line 16 is connected to the first driving transistor while a second power source line 17 is connected to the second driving transistor through a control switch (SW20). For example, the first power source line 16 functions as an anode line for a high gray scale display while the second power source line 17 functions as an anode line for a low gray scale display.

A capacitor line 19 is connected to the write switch 11 through a capacitor (Cs18) which is not necessarily provided. In other words, when the first and second driving transistors each has a large gate capacitance and a leak current from each transistor is an acceptable amount, the capacitor is not required to be provided. For example, when the first power source line or the second power source line has a constant potential, one of them can be used as a capacitor line.

In such a pixel configuration, a signal line for the high gray scale display and a signal line for the low gray scale display are not required to be provided, thus reduction in the aperture ratio can be prevented.

Next, an operation thereof is described.

The signal line 10 is inputted with a video signal as an analog signal, that is an analog potential (hereinafter this signal is referred to as a video signal potential). The video signal potential for the high gray scale display is determined so that (a video signal potential for the high gray scale display)=(a potential of an anode line for the high gray scale display–|Vth| of the first driving transistor) is satisfied. When the video signal potential for the high gray scale display is determined like this, a predetermined current is supplied to the light emitting element from the anode line for the high gray scale display. Although a very small amount of current may be supplied from the anode line for the low gray scale display, it can be ignored in many cases.

The video signal potential for the low gray scale display is determined so that (a potential of the anode line for the high gray scale display–|Vth| of the first driving transistor) <(a video signal potential for the low gray scale display)<(a potential of the anode line for the low gray scale display–|Vth| of the second driving transistor) is satisfied. When the video signal potential for the low gray scale display is determined like this, a predetermined current is supplied to the light emitting element from the anode line for the low gray scale display in the case of the low gray scale display. On the other hand, a current is not supplied to the light emitting element from the anode line for the high gray scale display in the high gray scale display of this state.

Based on such a video signal potential, a current is supplied to the light emitting element 14 from the first driving transistor 12 in the high gray scale display. Specifically, when the write switch 11 is turned ON, a charge is accumulated in the capacitor 18. After that, when a gate-source voltage (|Vgs|) of the first driving transistor 12 becomes higher than the threshold voltage (|Vth|), the first driving transistor 12 is turned ON. Then, a current according to a predetermined luminance is supplied from the first power source line. As described above, depending on the video signal voltage and a voltage of the anode line, a very small amount of current is supplied from the anode line for the low gray scale display as well, however, it can be ignored in many cases. The video signal voltage and the voltage of the anode line can be determined in consideration of the very small amount of current as well.

In the low gray scale display, a current is supplied from the second driving transistor 13 to the light emitting element 14. Specifically, when the write switch 11 is turned ON, a charge is accumulated in the capacitor 18 similarly to the high gray scale display. After that, when a gate-source voltage (|Vgs|) of the second driving transistor 13 becomes higher than the threshold voltage (|Vth|), the second driving transistor 13 is turned ON. Then, a current according to a predetermined luminance is supplied from the second power source line. In this manner, the light emitting element 14 emits light. Even when the write switch 11 is turned OFF, the light emitting element can keep emitting light by using the charge accumulated in the capacitor.

In the low gray scale display, the light emission period can be shortened by using the control switch 20. Specifically, after a predetermined period passes, the control switch 20 is turned OFF. As a result, |Vgs| of the driving transistor 13 for the low gray scale display can be set higher, thus an effect of variations in the threshold voltage can be reduced. In the case of shortening the light emission period by ⅕, for example, |Vgs| high enough to supply a current five times as much can be applied to the second driving transistor 13. Then, the control switch 20 is turned OFF and the light emission period is shortened so that a predetermined luminance can be obtained. It is to be noted that the control switch 20 can operate by a line sequential scanning at the same frequency as the write switch 11.

Figure 4:
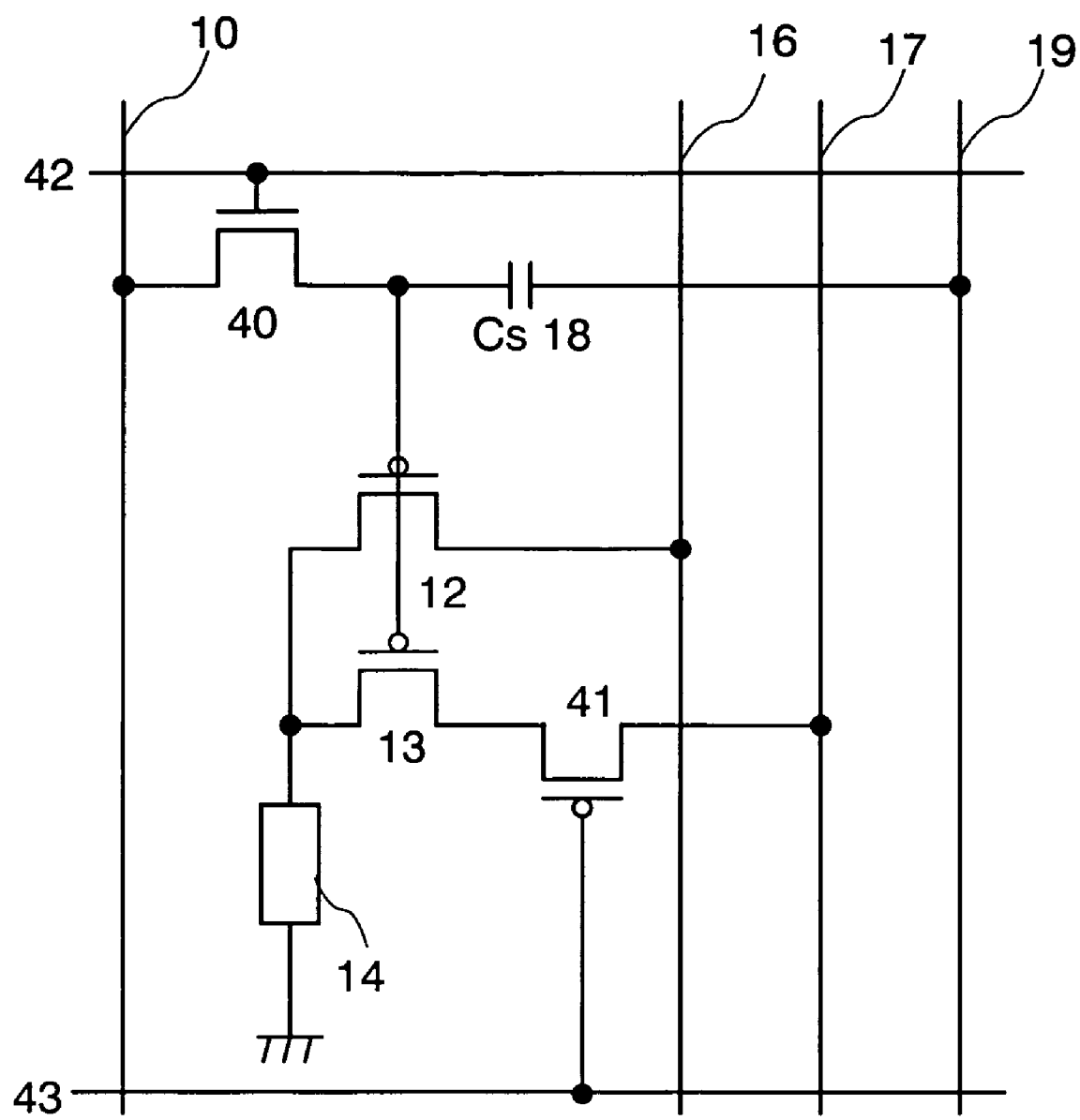
FIG. 4 is a diagram showing a pixel circuit of the invention.

In this embodiment mode, switches such as the write switch 11 and the control switch 20 can be formed of an analog switch and the like. FIG. 4 shows a pixel circuit in which a thin film transistor (TFT) containing polycrystalline silicon is used for the switches and each transistor of a pixel.

A transistor 40 corresponding to the write switch 11 (also referred to as a switching transistor) and a transistor 41 corresponding to the control switch 20 are provided. The transistor 40 is formed of an n-channel TFT while the transistor 41 is formed of a p-channel TFT. It is to be noted that the transistor 40 may have a multi-gate structure in which a plurality of gate electrodes are provided for one semiconductor film, for example a double-gate structure in which two gate electrodes are provided. A gate of the transistor 40 is connected to a first scan line 42 while a gate of the transistor 41 is connected to a second scan line 43. The transistors 12 and 13 can be formed of p-channel TFTs.

It is to be noted that an operating region of a TFT can be divided into a linear region and a saturation region. It is preferable that the transistors 40 and 41 that function as switches operate in the linear region while the transistors 12 and 13 for driving the light emitting element 14 operate in the saturation region.

For the transistor, an amorphous silicon thin film transistor or other thin film transistors can be used as well as a polycrystalline silicon thin film transistor. In other words, the structure of a transistor is not limited in this embodiment mode.

In such a pixel, a timing at which the transistor 41 corresponding to the control switch is turned ON or OFF is determined. The control switch and the write switch can operate at the same driving frequency and they may also operate by a line sequential scanning. Accordingly, the driving, that is the operation of the pixel in this embodiment mode can be simplified.

Figure 10:
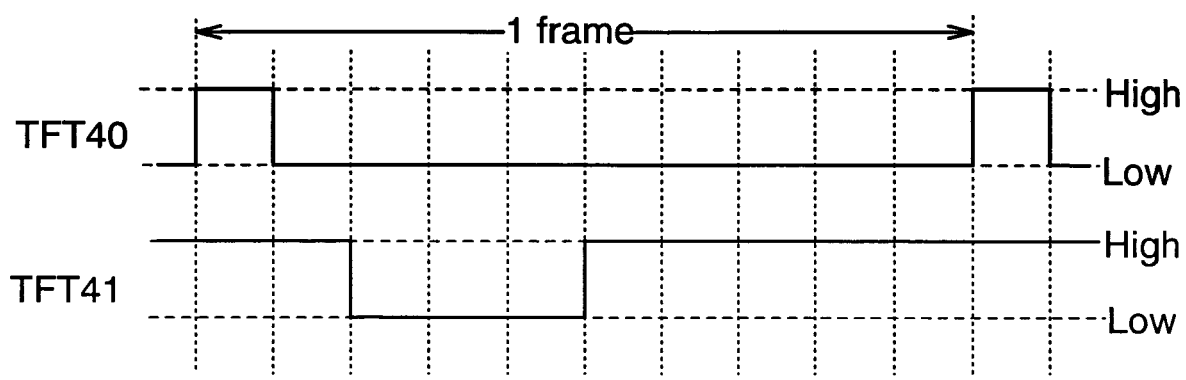
FIG. 10 is a timing chart of the invention.

FIG. 10 is a timing chart of the transistors 40 and 41. A High signal or a Low signal is inputted to the transistors 40 and 41 in one frame period. In this embodiment mode, a Low signal is inputted to the transistor 41 in 30% of one frame period. Then, the light emission period in the low gray scale display can be 30%. By setting the period in which a Low signal is inputted to the transistor 41 to be as long as an integral multiple of the period in which a High signal is inputted to the transistor 40, they can operate at the same driving frequency.

The timing at which a High signal or a Low signal is inputted to these switches is not limited to FIG. 10. For example, the transistors 40 and 41 may be turned ON at the same time. This is because drivers for the transistors 40 and 41 are provided respectively. The period in which a Low signal is inputted to the transistor 41 is not limited to FIG. 10. In the case of performing the low gray scale display, for example, a period in which a Low signal is inputted to the transistor 41 can be determined according to the gate-source voltage (|Vgs|) of the second driving transistor 13.

By turning ON and OFF the transistor 41, a predetermined luminance can be obtained in the low gray scale display even in the case of increasing the gate-source voltage (|Vgs|) of the second driving transistor 13.

Heretofore described is the case of dividing the gray scales into the high gray scale display and the low gray scale display, however, they may be divided into three or more groups as well. For example, by providing first to third power source lines as anode lines for the high gray scale display, the middle gray scale display, and the low gray scale display and providing driving transistors connected to each of them, the gray scales can be displayed as the high gray scale display, the middle gray scale display, and the low gray scale display.

According to this embodiment mode, the gate-source voltage (|Vgs|) of the driving transistor can be set higher in the low gray scale display, therefore, an effect of variations can be reduced. Moreover, a signal line for the high gray scale display and a signal line for the low gray scale display are not required to be provided additionally, thus it can be prevented that the aperture ratio is reduced.

EMBODIMENT MODE 2

In this embodiment mode, a pixel configuration different than that of the Embodiment Mode 1 is described.

Figure 2:
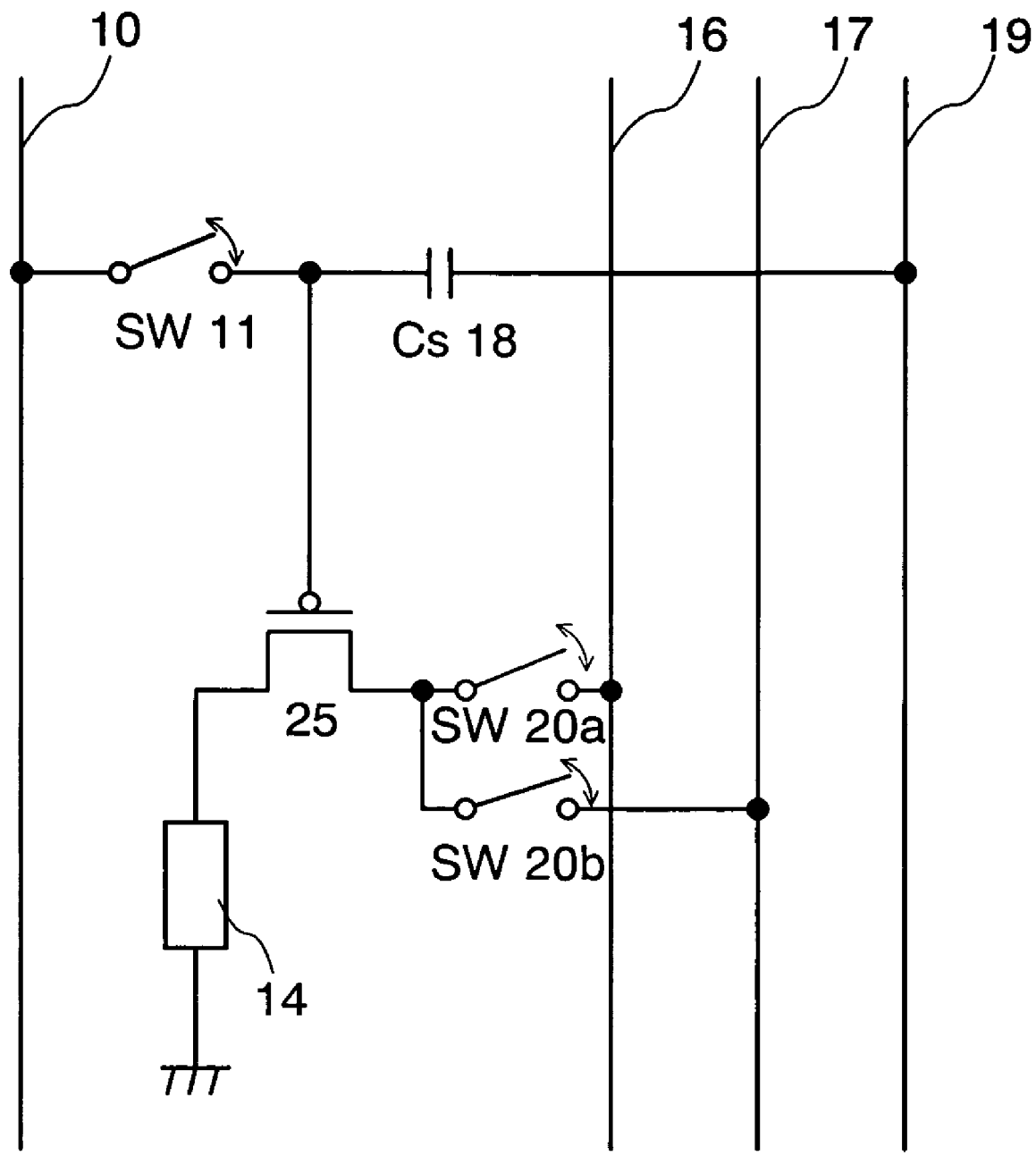
FIG. 2 is a diagram showing a pixel circuit of the invention.

As shown in FIG. 2, the pixel configuration of this embodiment mode is different than Embodiment Mode 1 in that a driving transistor 25, and a first control switch (SW20a) and a second control switch (SW20b) connected to one electrode of the driving transistor 25 are provided. For example, the first power source line 16 functions as an anode line for the high gray scale display while the second power source line 17 functions as an anode line for the low gray scale display. The other parts of the pixel configuration are similar to those of Embodiment Mode 1, therefore, the description thereof is omitted. In this embodiment mode also, the capacitor line 19 is not necessarily provided. For example, when the first power source line or the second power source line has a constant potential, one of them can be used as a capacitor line.

In such a pixel configuration, a signal line for the high gray scale display and a signal line for the low gray scale display are not required to be provided, thus it can be prevented that the aperture ratio is reduced.

Next, an operation thereof is described.

In this embodiment mode, a video signal voltage inputted to the signal line is determined similarly to Embodiment Mode 1. Based on such a video signal voltage, the first control switch (SW20a) and the second control switch (SW20b) are determined to be turned ON or OFF according to the high gray scale display or the low gray scale display. That is to say, the first control switch (SW20a) and the second control switch (SW20b) are switched over exclusively. As a result, it can be selected that the driving transistor 25 is connected to the first power source line 16 or the second power source line 17. By switching over this connection, a gate-source voltage (|Vgs|) of the driving transistor is switched over. Then, a light emitting element emits light based on the video signal for the low gray scale display or the high gray scale display. It is to be noted that the first and second control switches 20a and 20b can operate by a line sequential scanning at the same frequency as the write switch 11.

For example, in the case where a video signal for the low gray scale display is inputted, a current does not flow even when the driving transistor is connected to the first power source line 16 for the high gray scale display since |Vgs| of the driving transistor 25 is low. When the driving transistor 25 is connected to the second power source line 17 for the low gray scale display by switching over the control switch, current flows since |Vgs| is high, thus the light emitting element 14 emits light. In this manner, the low gray scale display or the high gray scale display can be performed.

In the low gray scale display, by switching over the first control switch (SW20a) and the second control switch (SW20b), the light emission period can be shortened. As a result, |Vgs| of the driving transistor 25 for the low gray scale display can be high, thus an effect of variations in threshold voltages can be reduced.

Figure 5:
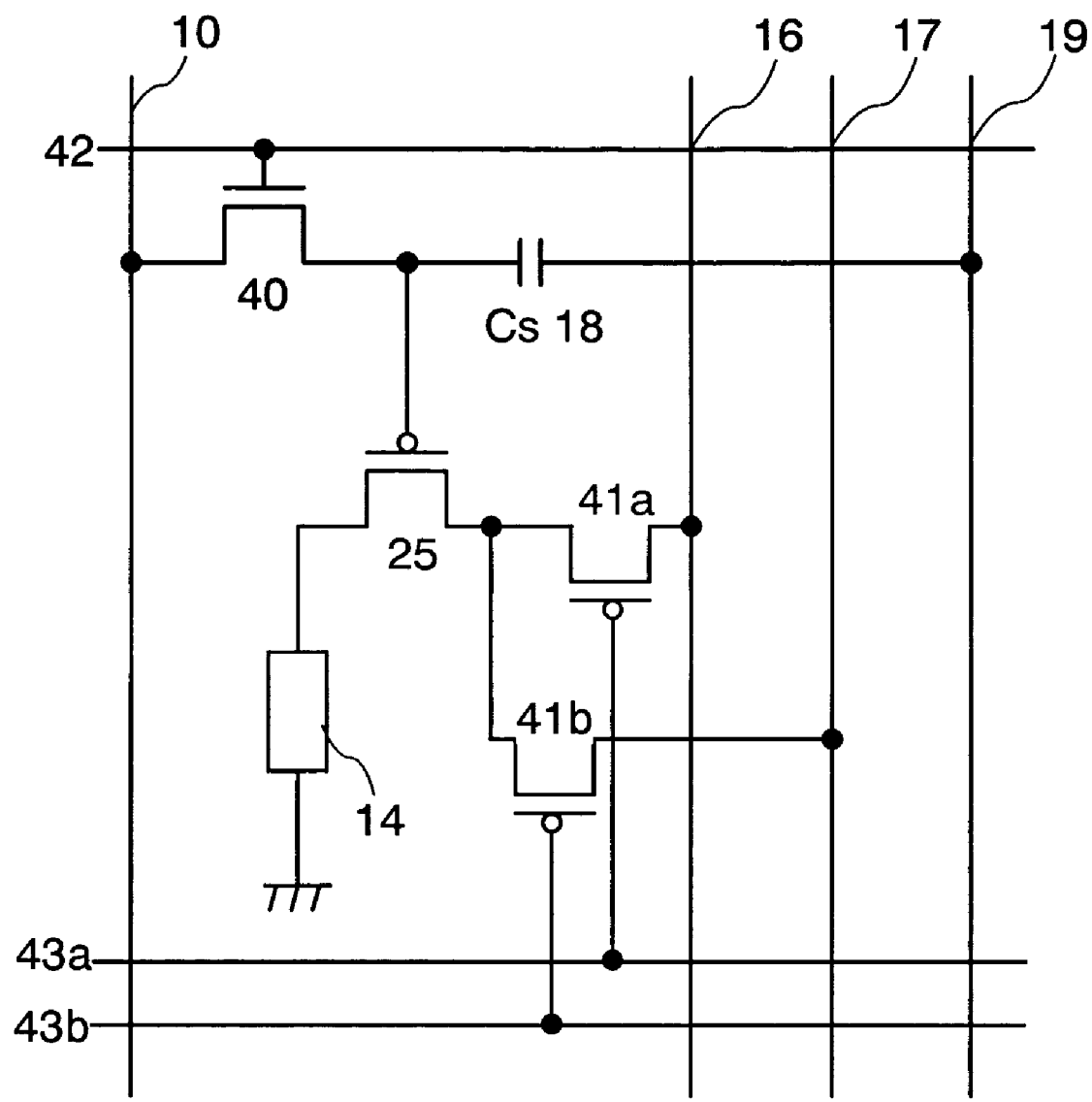
FIG. 5 is a diagram showing a pixel circuit of the invention.

In this embodiment mode, switches such as the write switch 11 and the control switch 20a and 20b can be formed of an analog switch and the like. FIG. 5 shows a pixel circuit in which a thin film transistor (TFT) containing polycrystalline silicon is used for the switches and each transistor of a pixel.

The transistor 40 corresponding to the write switch 11 (also referred to as a switching transistor) and transistors 41a and 41b corresponding to the control switches 20a and 20b are provided. The transistor 40 is formed of an n-channel TFT while the transistors 41a and 41b are formed of p-channel TFTs. It is to be noted that the transistor 40 may have a multi-gate structure in which a plurality of gate electrodes are provided for one semiconductor film, for example a double-gate structure in which two gate electrodes are provided. The gate of the transistor 40 is connected to a first scan line 42 while gates of the transistors 41a and 41b are connected to a second scan line 43a and a third scan line 43b respectively. It is to be noted that by changing the polarity of the transistors 41a and 41b, the second scan line 43a and the third scan line 43b can be shared. As a result, the aperture ratio of the pixel can be increased. The transistor 25 can be formed of a p-channel TFT.

It is to be noted that an operating region of a TFT can be divided into a linear region and a saturation region. It is preferable that the transistors 40, 41a and 41b that function as switches operate in the linear region while the transistor 25 for driving the light emitting element 14 operates in the saturation region.

For the transistor, an amorphous silicon thin film transistor or other thin film transistors can be used as well as a polycrystalline silicon thin film transistor. In other words, the structure of a transistor is not limited in this embodiment mode.

In such a pixel, a timing at which the transistors 41a and 41b corresponding to the control switches 20a and 20b are turned ON or OFF is determined. For example, it can be determined so that the transistor 41a is turned ON in 95% of one frame period while the transistor 41b is turned ON in the rest 5% thereof. As a result, the light emission period can be shortened in the low gray scale display. In other words, even in the case of increasing a gate-source voltage (|Vgs|) of the second driving transistor, a low gray scale display at a predetermined luminance can be performed.

The control switch and the write switch can operate at the same driving frequency and they may also operate by a line sequential scanning as well. Accordingly, the driving, that is the operation of the pixel in this embodiment mode can be simplified.

Figure 11:
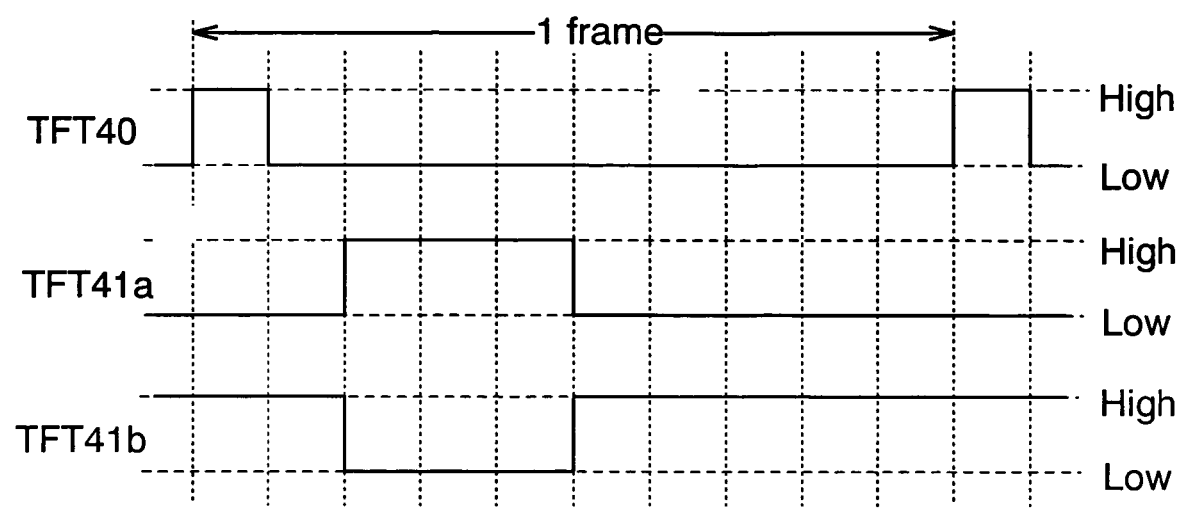
FIG. 11 is a timing chart of the invention.

FIG. 11 is a timing chart of the transistors 40, 41a and 41b. A High signal or a Low signal is inputted to the transistors 40, 41a and 41b in one frame period. In this embodiment mode, the description is made on the case where the transistors 41a and 41b are p-channel transistors. A High signal is inputted to the transistor 41a and a Low signal is inputted to the transistors 41b at the same time. In the case of using the transistors 41a and 41b as shown in FIG. 5, a High or Low signal is to be inputted thereto at the same time. In this embodiment mode, a High signal is inputted to the transistor 41a and a Low signal is inputted to the transistor 41b in 30% of one frame period. Accordingly, the light emission period in the low gray scale display can be 30% of one frame period. By setting the period in which a High signal is inputted to the transistors 41a and 41b to be as long as an integral multiple of the period in which a High signal is inputted to the transistor 40, they can operate at the same driving frequency.

The timing at which a High signal or a Low signal is inputted to these transistors is not limited to FIG. 11. For example, a High signal to the transistor 41a and a Low signal to the transistor 41b may be inputted at the same time as the transistor 40. This is because drivers for the transistors 40, 41a and 41b are provided respectively. The period in which a High signal is inputted to the transistor 41a is not limited to FIG. 11. In the case of performing a low gray scale display, for example, a period in which the transistors 41a and 41b are turned ON can be determined according to the gate-source voltage (|Vgs|) of the driving transistor 25.

Heretofore described is the case of dividing the gray scales into the high gray scale display and the low gray scale display, however, they may be divided into three or more groups as well. For example, by providing first to third power source lines as anode lines for the high gray scale display, the middle gray scale display, and the low gray scale display and providing control switches connected to each of them, the gray scales can be displayed as the high gray scale display, the middle gray scale display, and the low gray scale display.

EMBODIMENT MODE 3

In this embodiment mode, a pixel configuration different than that of Embodiment Modes 1 and 2 is described.

Figure 3:
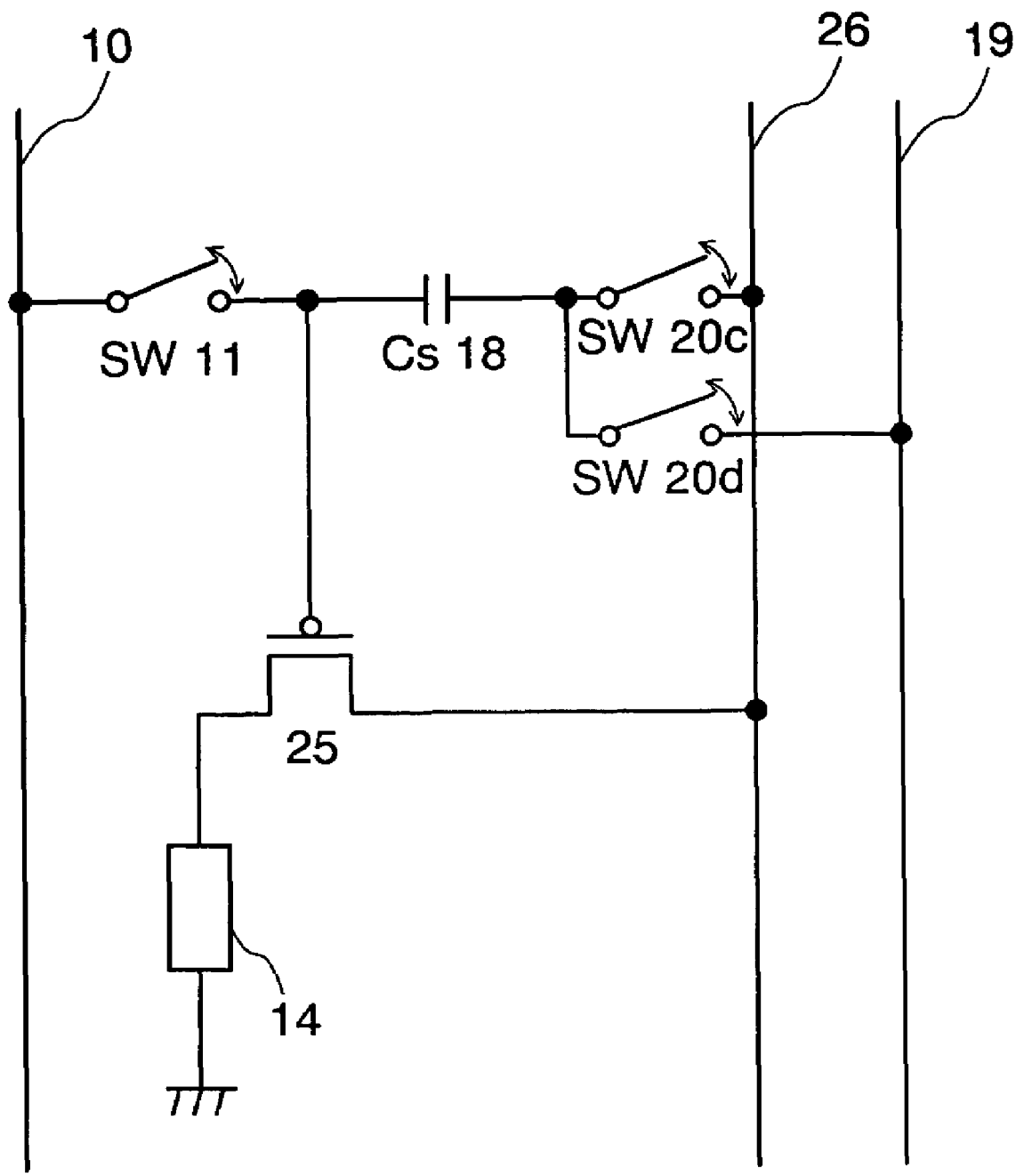
FIG. 3 is a diagram showing a pixel circuit of the invention.

As shown in FIG. 3, a pixel configuration of this embodiment mode is different than that of Embodiment Mode 2 in that a first control switch (SW20c) is provided between the capacitor 18 and a power source line 26, a second control switch (SW20d) is provided between the capacitor 18 and the capacitor line 19, and the transistor 25 is connected to the power source line 26. For example, the power source line 26 functions as an anode line for the high gray scale display while the capacitor line 19 functions as an anode line for the low gray scale display. The other parts of the pixel configuration are similar to those in Embodiment 2, therefore, the description thereof is omitted here.

According to the pixel configuration of this embodiment mode, the aperture ratio can be increased since the number of power source lines is small. Further, this embodiment mode is similar to Embodiment Modes 1 and 2 in that a signal line for the high gray scale display and a signal line for the low gray scale display are not required to be provided additionally.

A video signal potential in such a pixel configuration is determined as described below. A video signal potential for the high gray scale display is determined so that (a video signal potential for the high gray scale display)=(a potential of an anode line for the high gray scale display–|Vth| of a driving transistor) is satisfied, similarly to Embodiment Mode 1.

A video signal potential for the low gray scale display is determined so that (a potential of a capacitor line–|Vth| of a driving transistor)<(a potential of a power source line–|Vth| of the driving transistor)<(a video signal potential for the low gray scale display) is satisfied. This is called a condition 1. Alternatively, (the potential of the power source line–|Vth| of the driving transistor)<(the video signal potential for the low gray scale display)<(the potential of the capacitor line–|Vth| of the driving transistor) is to be satisfied. This is called a condition 2. Further, (the video signal potential for the low gray scale display)–{(the potential of the power source line)–(the potential of the capacitor line)}<(the potential of the power source line–|Vth| of the driving transistor) is satisfied. This is called a condition 3. Such a video signal potential for the low gray scale display is determined by turning ON either the first control switch (SW20c) or the second control switch (SW20d) when writing the video signal.

In the low gray scale display, the light emission period can be shortened by the control switches 20c and 20d. At the same time, by changing the control switches 20c and 20d by a potential difference between the capacitor line 19 and the power source line 26, |Vgs| of the driving transistor 25 can be increased, thus an effect of variations in threshold voltages can be reduced. It is to be noted that the first and the second control switches 20c and 20d can operate by a line sequential scanning at the same frequency as the write switch 11.

Figure 6:
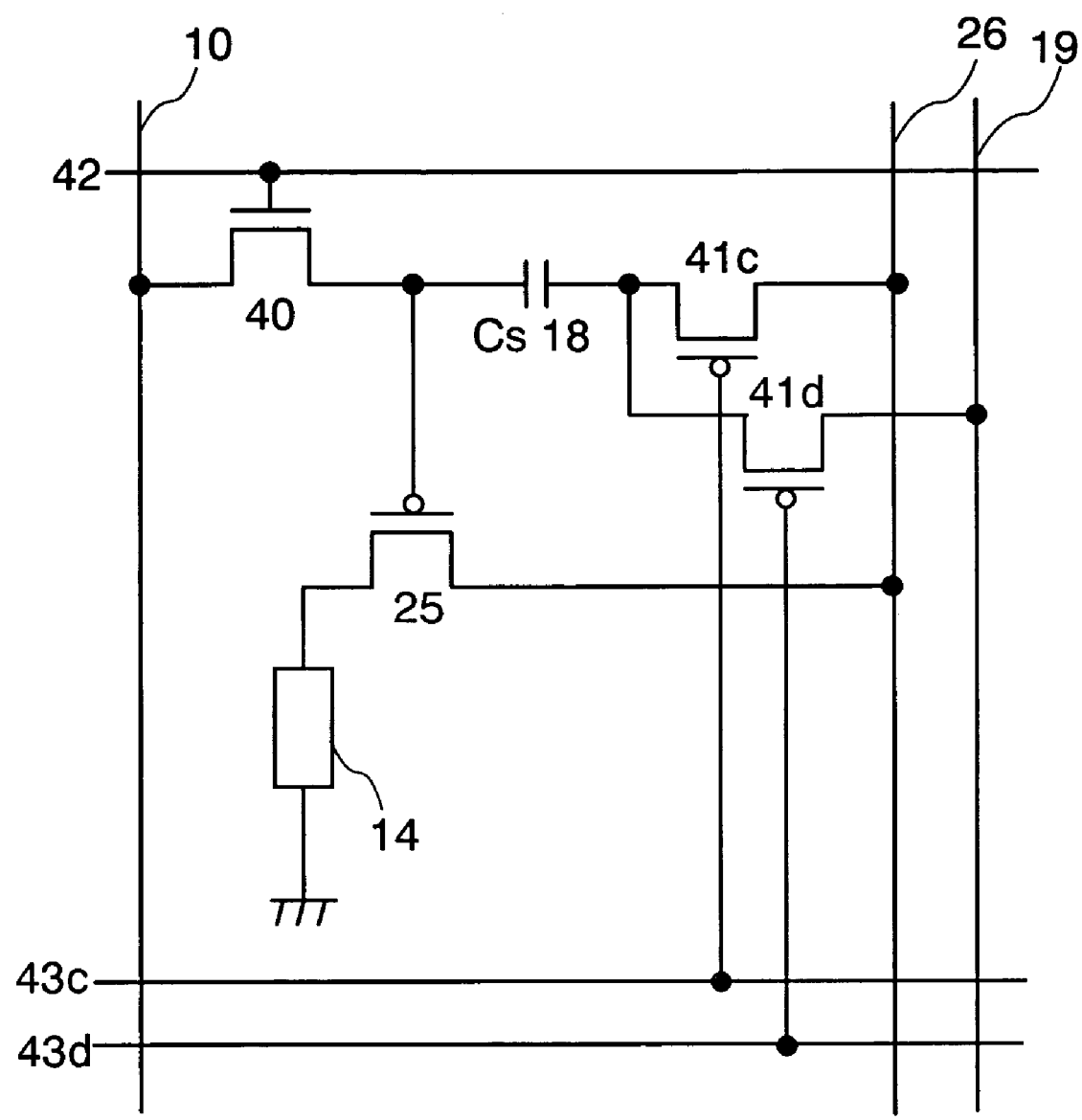
FIG. 6 is a diagram showing a pixel circuit of the invention.

In this embodiment mode, switches such as the write switch 11 and the control switches 20c and 20d can be formed of an analog switch and the like. FIG. 6 shows a pixel circuit in which a thin film transistor (TFT) containing polycrystalline silicon is used for the switches and each transistor of a pixel.

The transistor 40 corresponding to the write switch 11 (also referred to as a switching transistor) and the transistors 41a and 41b corresponding to the control switches 20c and 20d are provided. The transistor 40 is formed of an n-channel TFT while the transistors 41a and 41b are formed of p-channel TFTs. It is to be noted that the transistor 40 may have a multi-gate structure in which a plurality of gate electrodes are provided for one semiconductor film, for example a double-gate structure in which two gate electrodes are provided. The gate of the transistor 40 is connected to the first scan line 42 while the gates of the transistors 41a and 41b are connected to the second scan line 43c and a third scan line 43d respectively. It is to be noted that by changing the polarity of the transistors 41a and 41b, the second scan line 43c and the third scan line 43d can be shared. As a result, the aperture ratio of the pixel can be increased. The transistor 25 can be formed of a p-channel TFT.

It is to be noted that an operating region of a TFT can be divided into a linear region and a saturation region. It is preferable that the transistors 40, 41a and 41b that function as switches operate in the linear region while the transistor 25 for driving the light emitting element 14 operates in the saturation region.

For the transistor, an amorphous silicon thin film transistor or other thin film transistors can be used as well as a polycrystalline silicon thin film transistor. In other words, the structure of a transistor is not limited in this embodiment mode.

In such a pixel, a timing at which the transistors 41a and 41b corresponding to the control switches 20c and 20d are turned ON or OFF is determined. For example, the transistor 41a is turned ON in 95% of one frame period while the transistor 41b is turned ON in the rest 5% thereof. On the contrary, the transistor 41b may be turned ON in 95% of one frame period while the transistor 41a is turned ON in the rest 5% thereof. As a result, the light emission period can be shortened in the low gray scale display. In other words, even in the case of increasing a gate-source voltage (|Vgs|) of the second driving transistor, a low gray scale display at a predetermined luminance can be performed.

The control switch and the write switch can operate at the same driving frequency and they may also operate by a line sequential scanning as well. Accordingly, the driving, that is the operation of the pixel in this embodiment mode can be simplified.

Figure 12A:
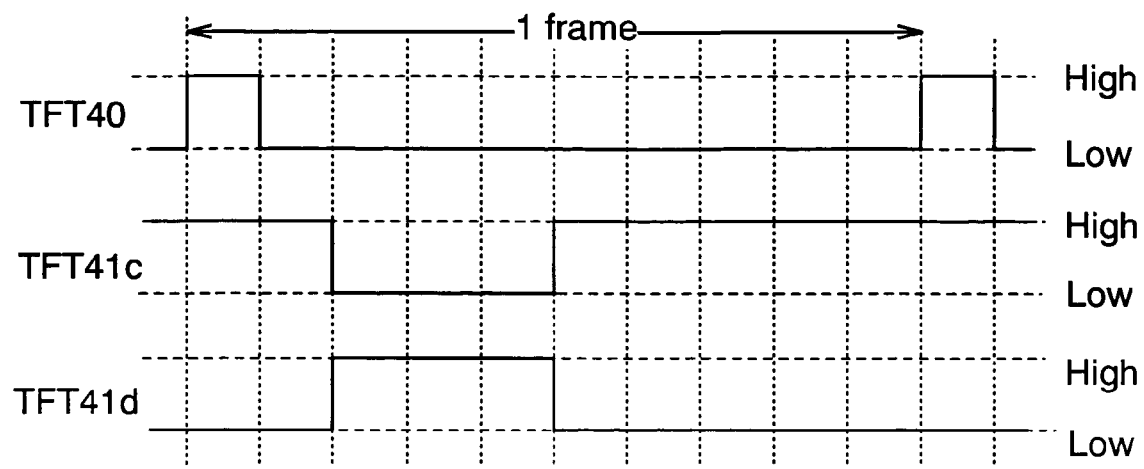
FIGS. 12A and 12B are timing charts of the invention.
Figure 12B:
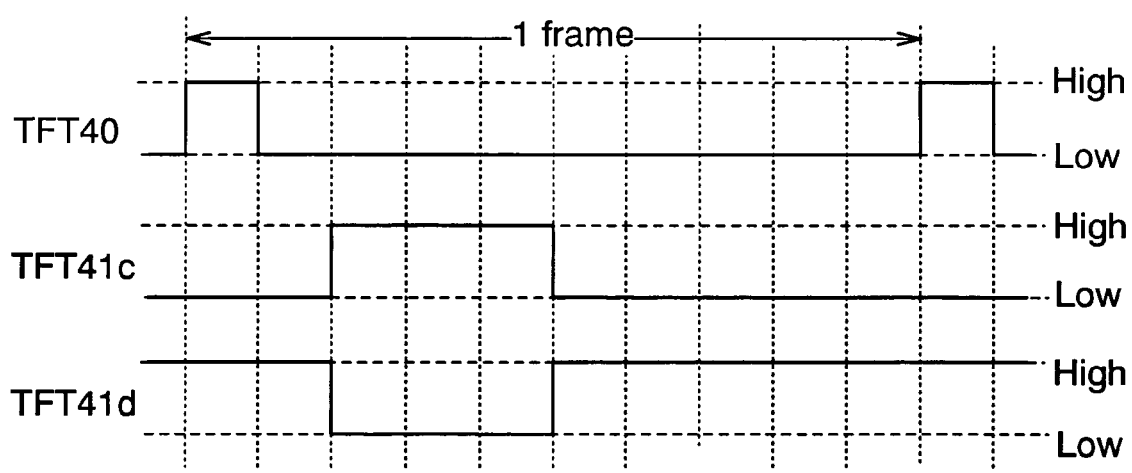

FIGS. 12A and 12B are timing charts of the transistors 40, 41c and 41d in the conditions 1 and 2 respectively. A High signal or a Low signal is inputted to the transistors 40, 41c and 41d in one frame period in FIGS. 12A and 12B. FIGS. 12A and 12B are similar to each other in that a Low signal is inputted to the transistor 41c or 41d connected to a high potential side of the power source line 26 and the capacitor line 19 when writing a video signal. That is to say, a High or Low signal is to be inputted to the transistor 41c or 41d according to the condition 1 or 2. In this embodiment mode, a period in which a Low signal is inputted to the transistor 41c and a period in which a High signal is inputted to the transistor 41d are 30% of one frame period in the condition 1. In the condition 2, a period in which a High signal is inputted to the transistor 41c and a period in which a Low signal is inputted to the transistor 41d are 30% of one frame period. Then, a light emission period in the low gray scale display can be set 30%. By determining a period in which a High signal is inputted to the transistor 41c so as to be as long as an integral multiple of a period in which a High signal is inputted to the transistor 40, they can operate at the same frequency.

The timing at which a High signal or a Low signal is inputted to these switches is not limited to FIGS. 12A and 12B. For example, a High signal may be inputted to the transistor 41c and a Low signal may be inputted to the transistor 41d at the same time as the transistor 40. However, it is not easy to switch over a signal to the transistors 41c and 41d when the transistor 40 is at High. This is because the transistors 41c and 41d are provided between the capacitor 18 and the power source line 26, and between the capacitor 18 and the capacitor line 19 respectively. Specifically, when accumulating a charge into the capacitor 18 based on a video signal voltage when the transistor 40 is selected, the transistors 41c and 41d are required to be fixed ON or OFF. Moreover, a period in which a High signal is inputted to the transistors 41c and 41d is not limited to FIGS. 12A and 12B. In the case of the low gray scale display, for example, a period in which transistors 41c and 41d are turned ON can be determined according to the gate-source voltage (|Vgs|) of the driving transistor 25.

Heretofore described is the case of dividing the gray scales into the high gray scale display and the low gray scale display, however, they may be divided into three or more groups as well. For example, by providing first and second capacitor lines and control switches connected to each of them, the gray scales can be displayed as the high gray scale display, the middle gray scale display, and the low gray scale display.

EMBODIMENT MODE 4

In this embodiment mode, a pixel configuration having a light emitting element is described. It is to be noted that a thin film transistor (TFT) containing polycrystalline silicon is used as a transistor in this embodiment mode.

Figure 7A:
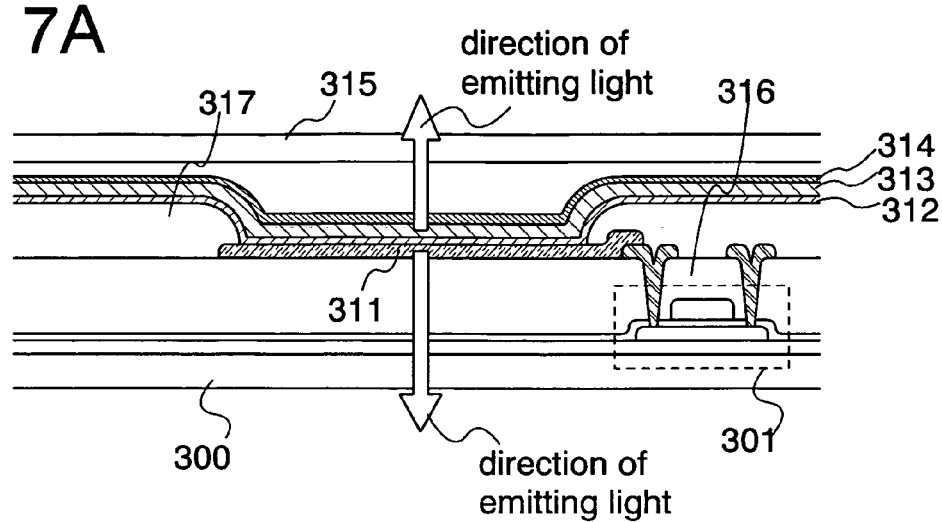
FIGS. 7A to 7C are diagrams showing a pixel configuration of the invention.

As shown in FIG. 7A, a p-channel driving TFT (TFT is employed as a transistor) 301 provided over a substrate 300 having an insulating surface can have a crystalline silicon film as a semiconductor film. A crystalline semiconductor film can be formed by thermal crystallisation or by laser irradiation, or using a catalytic effect of a metal element such as nickel and titanium. In the case of irradiating laser, laser light from a continuous oscillation laser (CW laser) or a pulsed oscillation laser (a pulsed laser) can be used. For the laser light, one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, or a gold vapor laser can be used. By irradiating a fundamental wave of such laser light, and second to fourth harmonic waves of the fundamental wave, large grain crystals can be formed. For example, a second harmonic (532 nm) and a third harmonic (355 nm) of a Nd: $YVO_4$ laser (fundamental wave of 1064 nm) can be used.

A gate electrode and a gate line are provided over the semiconductor film with a gate insulating film interposed therebetween. The semiconductor film under the gate electrode corresponds to a channel forming region. The semiconductor film includes an impurity region corresponding to a source region or a drain region. The impurity region can be formed in a self-aligned manner by adding impurity elements such as boron to the semiconductor film with the gate electrode as a mask. A first insulating film 316 is provided so as to cover the gate electrode, and contact holes are provided in the first insulating film over the impurity region of the semiconductor film. Wirings are provided in the contact holes, which function as a source wiring and a drain wiring. The insulating film can be formed of an organic material and an inorganic material. For the organic material, a photosensitive or non-photosensitive organic material (an organic resin material such as polyimide, acrylic, polyamide, polyimide amide, benzocyclobutene, and siloxane) and a resist can be used. Siloxane is a material which is composed of a skeleton formed by the bond of silicon and oxygen and which includes either an organic group containing at least hydrogen (such as an alkyl group or aromatic hydrocarbon) or a fluoro group or both as a substituent. Alternatively, a fluoro group may be used as the substituent. For the inorganic material, an insulating film containing oxygen or nitrogen, such as a silicon oxide ($SiO_x$), silicon nitride ($SiN_x$), silicon oxynitride ($SiO_xN_y$) (x>y), silicon nitride oxide ($SiN_xO_y$) (x>y) (x, y=1, 2 . . . ) and polysilazane, which is formed from a liquid material including a polymer material having a bond of silicon (Si) and nitrogen (N), can be used. For the insulating film, a stacked-layer structure of these films may be used as well. For the insulating film, in particular, it is preferable to form an organic material for planarizing the film and then an inorganic material thereover for preventing moisture and oxygen from being absorbed in the organic material.

A first electrode 311 of a light emitting element is provided so as to be electrically connected to a drain electrode. The first electrode 311 functions as an anode of the light emitting element. A second insulating film is provided so as to cover the first electrode 311. The second insulating film 317 has an aperture on the first electrode. An electroluminescent layer 312 is provided in the aperture and a second electrode 313 of the light emitting element is provided so as to cover the electroluminescent layer and the second insulating film. The second electrode functions as a cathode of the light emitting element. That is, the light emitting element includes the first electrode 311, the electroluminescent layer 312, and the second electrode 313.

The electroluminescent layer 312 includes an HIL (hole injection layer), an HTL (hole transporting layer), an EML (light emitting layer), an ETL (electron transporting layer), and an EIL (electron injection layer) stacked in this order from the first electrode 311 side. Typically, CuPu is used for the HIL, a-NPD is used for the HTL, BCP is used for the ETL, and BCP:Li is used for the EIL.

For the electroluminescent layer 312, materials which exhibit red (R), green (G), and blue (B) color light emissions can be used. As a result, a full color display can be performed. Such materials which exhibit red (R), green (G), and blue (B) color light emissions may be selectively formed by an evaporation method using an evaporation mask, a droplet discharging method (also referred to as an ink-jetting method) and the like. Specifically, CuPu or PEDOT is used for the HIL, a-NPD is used for the HTL, BCP or $Alq_3$ is used for the ETL, and BCP:Li or $CaF_2$ is used for the EIL. For example, $Alq_3$ doped with a dopant (DCM and the like for R and DMQD and the like for G) corresponding to each light emission color of R, G, and B may be used for the EML.

The structure of the electroluminescent layer 312 is not limited to the aforementioned stacked-layer structure. For example, the electroluminescent layer 312 may have any of a single layer structure, a stacked-layer structure, and a mixed-layer structure having no interfaces between the layers. Moreover, a singlet material, a triplet material, or a mixed material of them can be used. For example, a triplet material is used as a material which exhibits red color (R) light emission while a single material can be used as a material which exhibits green color (G) and blue color (B). Furthermore, any of an organic material containing a low polymeric material, a high polymeric material, and a middle polymeric material, an inorganic material typified by molybdenum oxide superior in electron injection property, a mixed material of organic and inorganic materials may be used.

In the case of forming an electroluminescent layer which exhibits white color light emission, a color filter, or a color filter and a color conversion layer, and the like may be additionally provided. As a result, a full color display can be performed. This color filter and the color conversion layer can be formed over a second substrate 315 which is to be attached to the first substrate thereafter.

The material of the first electrode 311 and the second electrode 313 are selected in consideration of the work function.

For example, the first electrode 311 which functions as an anode is preferably formed of a metal, an alloy, a conductive compound, and a mixture of them, each having a large work function (work function of 4.0 eV or higher). As specific materials, ITO (indium tin oxide), IZO (indium zinc oxide) obtained by mixing 2 to 20% of zinc oxide (ZnO) into indium oxide, gold (Au), platinum (Pt), nickel (Ni), tungsten (W), chromium (Cr), molybdenum (Mo), iron (Fe), cobalt (Co), copper (Cu), palladium (Pd), or nitride of a metal material (TiN) and the like can be used.

On the other hand, the second electrode 313 which functions as a cathode is preferably formed of a metal, an alloy, a conductive compound, and a mixture of them, each having a low work function (a work function of 3.8 eV or lower). As specific materials, there are elements belonging to group 1 or 2 of Periodic Table of Elements, that are an alkaline metal such as Li and Cs, Mg, Ca, and Sr, an alloy containing these (Mg:Ag, Al:Li), a compound (LiF, CsF, $CaF_2$), and a transition metal containing a rare earth metal. Moreover, when the second electrode is required to transmit light, the aforementioned metal or alloy containing them may be formed quite thin and stacked to a metal such as ITO (including an alloy).

The first electrode 311 and the second electrode 313 can be formed by an evaporation method, a sputtering method, an ink-jetting method and the like.

The first electrode 311 and the second electrode 313 can both be an anode or a cathode according to the pixel configuration. For example, in the case of forming the driving TFT as an n-channel TFT, the first electrode 311 functions as a cathode while the second electrode 313 functions as an anode. In the case of forming the driving TFT as an n-channel TFT, other TFTs in the pixel can be formed of n-channel TFTs. As a result, a TFT manufacturing process can be simplified.

It is preferable to provide a passivation film 314 containing nitrogen over the second electrode 313. For example, a silicon nitride film is preferable. A diamond-like carbon (DLC) film may be provided as the passivation film as well. The passivation film 314 can be formed by a sputtering method and a CVD method. The passivation film 314 can prevent moisture and oxygen that cause degradation from entering.

The space between the first substrate 300 and the second substrate (sealing substrate) 315 attached to each other may be injected with nitrogen, and a drying agent may be additionally provided therein. Instead of injecting nitrogen, the space may be filled with a resin which transmits light and has high water absorbing property as well. As a result, oxygen and moisture can be prevented from entering.

After attaching the first substrate 300 and the second substrate 315 to each other, the edges of these substrates may be covered with the first electrode 311, the second electrode 313, other electrodes, and an insulating film. As a result, oxygen and moisture can be prevented from entering.

In order to enhance the contrast, a polarizer or a circular polarizer may be provided in a display region of the first substrate 300 or a display region of the second substrate 315. As a result, quality of the black display can be enhanced and the contrast can be improved.

A display device having such a pixel configuration emits light based on a video signal inputted from the signal line. Specifically, the video signal is an analog signal having a voltage value, as described above. When the analog signal is inputted when a switching TFT is ON, a driving TFT is turned ON and the light emitting element emits light based on the gate-source voltage (Vgs) of the driving TFT.

For example, in a display device having the first electrode 311 and the second electrode 313 formed of a material which transmits light, light is emitted in both directions (directions of arrows) relatively to the light emitting element as shown in FIG. 7A. Such a display device can transmit light when no light is being emitted.

Figure 7B:
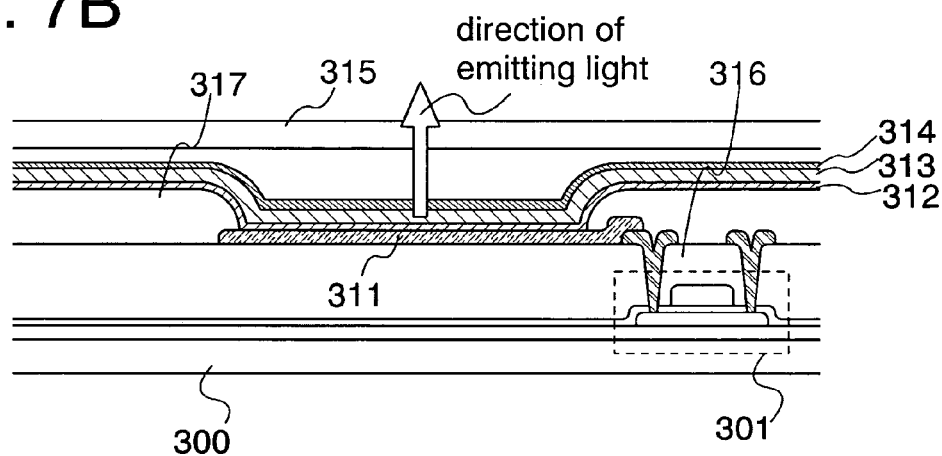

In a display device having the second electrode 313 formed of a material which transmits light, light is emitted only to the sealing substrate 315 side as shown in FIG. 7B. Therefore, the first electrode 311 is formed of a material which does not transmit light. Furthermore, it is preferable to form the first electrode 311 of a highly reflective material. The other parts are similar to FIG. 7A, therefore, the description is omitted here. In the case where the aperture ratio may be reduced due to the transistors in the pixel, it is preferable that the light be emitted to the sealing substrate 315 side as shown.

Figure 7C:
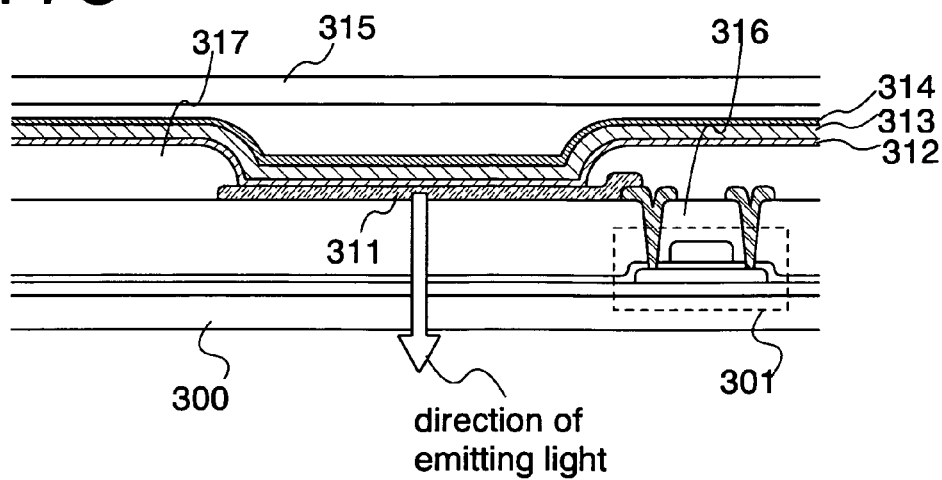

In a display device having the first electrode 311 formed of a material which transmit light, light is emitted only to the first substrate 300 side as shown in FIG. 7C. Therefore, the second electrode 313 is formed of a material which does not transmit light. Furthermore, it is preferable to form the second electrode 313 of a highly reflective material. The other parts are similar to FIG. 7A, therefore, the description is omitted here.

As shown in FIGS. 7B and 7C, by using a highly reflective conductive film for the electrode of the light emitting element provided on a side to which the light is not emitted, light can be effectively utilized.

In this embodiment mode, the electrode which transmits light is formed by forming a conductive film which does not transmit light so as to be thin enough to transmit light and stacking thereover a conductive film which transmits light, for example an ITO.

EMBODIMENT MODE 5

A display device having the pixel configuration described in the aforementioned embodiment modes can be applied to various electronic apparatuses. The electronic apparatuses include a portable information terminal (a portable phone, a mobile computer, a portable game machine, an electronic book and the like), a video camera, a digital camera, a goggle type display, a display, a navigation system, and the like. Specific examples of these electronic apparatuses are shown in FIGS. 8A to 8E.

Figure 8A:
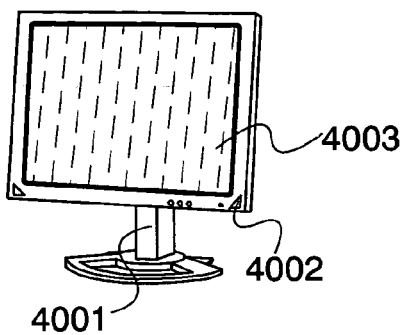
FIGS. 8A to 8E are views showing electronic apparatuses each having a pixel circuit of the invention.

FIG. 8A illustrates a display including a housing 4001, an audio output portion 4002, a display portion 4003 and the like. The display device having the pixel configuration of the invention can be applied to the display portion 4003. As a result, a display with less effect of variations of driving transistors can be performed even in the low gray scale display. It is to be noted that the display device includes all display devices for displaying information such as for a computer, TV broadcasting receiver, and advertising display.

Figure 8B:
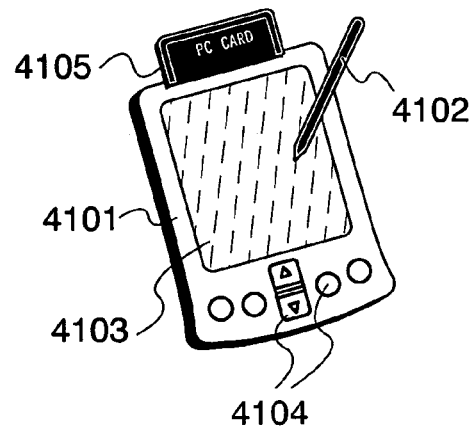

FIG. 8B illustrates a mobile computer including a main body 4101, a stylus 4102, a display portion 4103, operating buttons 4104, an external interface 4105 and the like. The display device having the pixel configuration of the invention can be applied to the display portion 4103. As a result, a display with less effect of variations of driving transistors can be performed even in the low gray scale display.

Figure 8C:
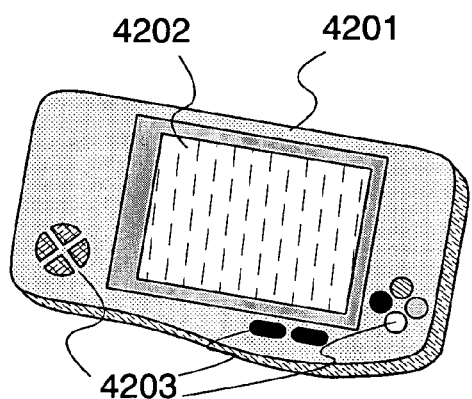

FIG. 8C illustrates a game machine including a main body 4201, a display portion 4202, operating buttons 4203, and the like. The display device having the pixel configuration of the invention can be applied to the display portion 4202. As a result, a display with less effect of variations of driving transistors can be performed even in the low gray scale display.

Figure 8D:
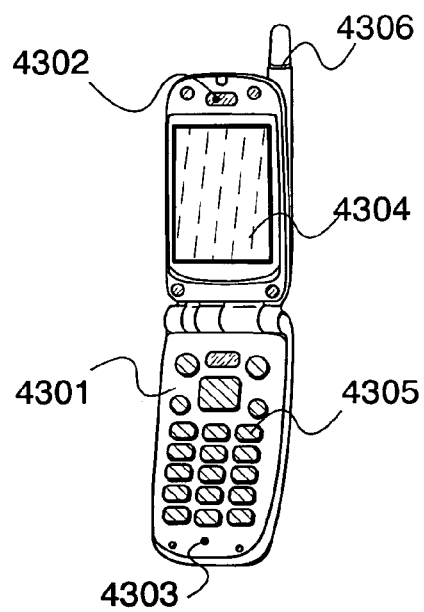

FIG. 8D illustrates a portable phone including a main body 4301, an audio output portion 4302, an audio input portion 4303, a display portion 4304, an operating switch 4305, an antenna 4306, and the like. The display device having the pixel configuration of the invention can be applied to the display portion 4304. As a result, a display with less effect of variations of driving transistors can be performed even in the low gray scale display.

Figure 8E:
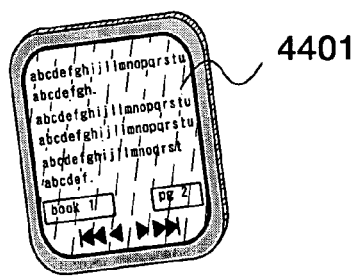

FIG. 8E illustrates an electronic book reader including a display portion 4401 and the like. The display device having the pixel configuration of the invention can be applied to the display portion 4401. As a result, a display with less effect of variations of driving transistors can be performed even in the low gray scale display.

As described above, an application range of the invention is quite wide and the invention can be applied to electronic apparatuses of various fields. By applying the invention, a display with less effect of variations of driving transistors can be performed even in the low gray scale display. Moreover, by using a flexible substrate for an insulating substrate of an active matrix substrate, a thin and lightweight device can be realized.

Next, results of the evaluation of variations of driving TFTs in the case of 64-gray scale (6-bit) display are shown.

In the highest luminance 63 of the high gray scale display, the current is set 0.56 µA (200 cd/m$^2$) and a drain-source voltage (Vds) of the driving TFT is set −15 V. Table 1 shows values of L/W when the length of the channel length of the driving TFT of each sample is L and the length (width) perpendicular to the channel length of the driving TFT of each sample is W.

TABLE 1

|  | sample 1 | sample 2 | sample 3 | sample 4 |
|---|---|---|---|---|
| L/W | 80/4 | 120/4 | 320/4 | 480/4 |

Figure 9:
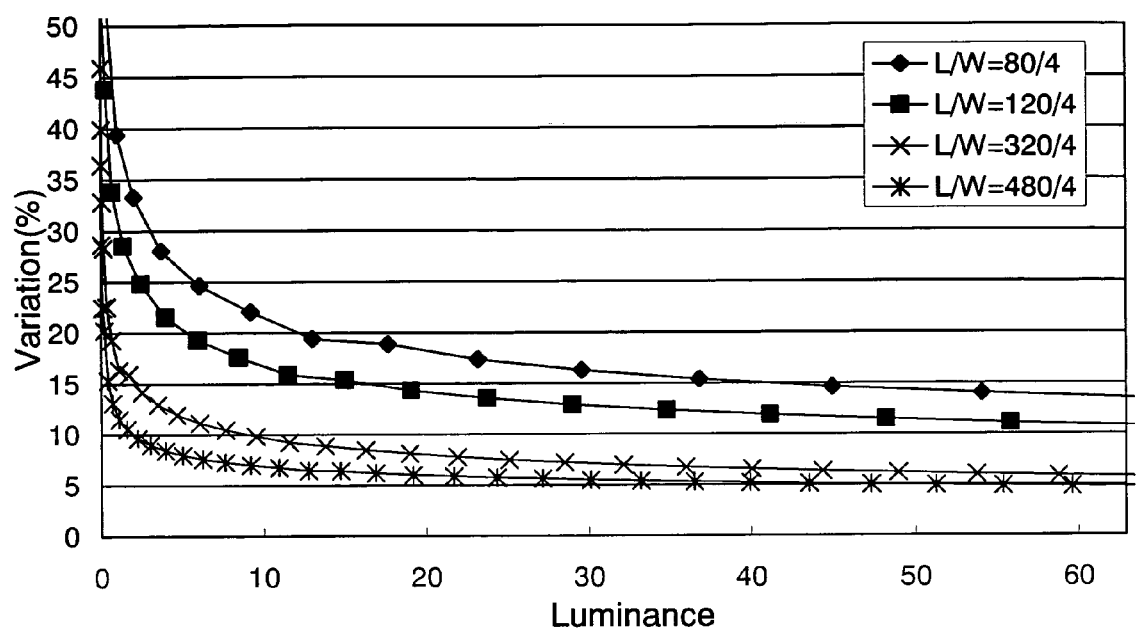
FIG. 9 is a graph showing variations in currents flowing through driving transistors relative to gray scale.

FIG. 9 shows variations of currents (Ids) flowing through the driving TFTs when a 64 gray scale (6-bit) display is performed by inputting video signal voltage to the signal line under the aforementioned conditions. The variations in the currents (Ids) flowing through the driving TFTs at this time present at a ratio of 3 s. That is to say, the variations are obtained by the formula: variations=Ids (3 s)/Ids (average).

As shown in FIG. 9, the variations in the current (Ids) flowing through the driving TFT are increased in the low gray scale display. According to this experiment, it can be found out that the variations in driving TFTs are notable in the case of the low gray scale display in which a very small amount of current is supplied to the light emitting element. The inventors found out from this experiment that the variations in the threshold voltages of the driving TFTs are notable in the case of the low gray scale display.

This application is based on Japanese Patent Application serial no. 2004-134723 filed in Japan Patent Office on Apr. 28, 2004 the entire contents of which are hereby incorporated by reference.

What is claimed is:

1. A display device comprising:
   a signal line to which an analog signal is inputted;
   a first transistor and a second transistor for driving a light emitting element;
   a first power source line;
   a second power source line; and
   a switch provided between the second transistor and the second power source line,
   wherein a current is supplied to the light emitting element from the first power source line by using the first transistor based on the analog signal,
   wherein a current is supplied to the light emitting element from the second power source line by using the second transistor based on the analog signal, and
   wherein a connection between the second transistor and the second power source line is disconnected by the switch per predetermined period.

2. The display device according to claim 1, further comprising:
   a switching transistor,
   wherein one electrode of the switching transistor is connected to the signal line and the other electrode of the switching transistor is connected to a gate electrode of the first transistor and the second transistor.

3. The display device according to claim 1, wherein a potential of the second power source line is higher than a potential of the first power source line.

4. The display device according to claim 1, wherein the display device is incorporated into an electronic apparatus selected from the group consisting of a camera such as a digital camera and a video camera, a goggle type display, a navigation system, a mobile computer, a game machine, a display, an electronic book, a portable phone and an electronic book reader.

5. A display device comprising:
   a signal line to which an analog signal is inputted;
   a capacitor line connected to the signal line through a capacitor;
   a first transistor and a second transistor for driving a light emitting element;
   a first power source line;
   a second power source line; and
   a switch provided between the second transistor and the second power source line,
   wherein a gate electrode of the first transistor is connected to the capacitor and one electrode of the first transistor is connected to the first power source line, and
   wherein a gate electrode of the second transistor is connected to the capacitor and one electrode of the second transistor is connected to the second power source line.

6. The display device according to claim 5, wherein the other electrode of the first transistor and the other electrode of the second transistor are connected to an electrode of the light emitting element.

7. The display device according to claim 5, further comprising:
   a switching transistor,
   wherein one electrode of the switching transistor is connected to the signal line and the other electrode of the switching transistor is connected to the gate electrode of the first transistor and the second transistor.

8. The display device according to claim 5, wherein a potential of the second power source line is higher than a potential of the first power source line.

9. The display device according to claim 5, wherein the display device is incorporated into an electronic apparatus selected from the group consisting of a camera such as a digital camera and a video camera, a goggle type display, a navigation system, a mobile computer, a game machine, a display, an electronic book, a portable phone and an electronic book reader.

10. A display device comprising:
    a signal line to which analog signal is inputted;
    a transistor for driving a light emitting element;
    a first power source line;
    a second power source line;
    a first switch provided between the transistor and the first power source line; and
    a second switch provided between the transistor and the second power source line,
    wherein a current is supplied to the light emitting element from the first power source line based on the analog signal;
    wherein a current is supplied to the light emitting element from the second power source line based on the analog signal, and
    wherein a connection between the transistor and the second power source line is disconnected by the second switch per predetermined period.

11. The display device according to claim 10, further comprising:
    a switching transistor,
    wherein one electrode of the switching transistor is connected to the signal line and the other electrode of the switching transistor is connected to a gate electrode of the transistor.

12. The display device according to claim 10, wherein a potential of the second power source line is higher than a potential of the first power source line.

13. The display device according to claim 10, wherein the display device is incorporated into an electronic apparatus selected from the group consisting of a camera such as a digital camera and a video camera, a goggle type display, a navigation system, a mobile computer, a game machine, a display, an electronic book, a portable phone and an electronic book reader.

14. A display device comprising:
    a signal line to which an analog signal is inputted;
    a capacitor line connected to the signal line through a capacitor;

a transistor for driving a light emitting element;
a first power source line;
a second power source line;
a first switch provided between the transistor and the first power source line; and
a second switch provided between the transistor and the second power source line,
wherein a gate electrode of the transistor is connected to the capacitor and one electrode of the transistor is connected to the first switch and the second switch.

15. The display device according to claim 14, wherein the other electrode of the transistor is connected to an electrode of the light emitting element.

16. The display device according to claim 14, further comprising:
a switching transistor,
wherein one electrode of the switching transistor is connected to the signal line and the other electrode of the switching transistor is connected to the gate electrode of the transistor.

17. The display device according to claim 14, wherein a potential of the second power source line is higher than a potential of the first power source line.

18. The display device according to claim 14, wherein the display device is incorporated into an electronic apparatus selected from the group consisting of a camera such as a digital camera and a video camera, a goggle type display, a navigation system, a mobile computer, a game machine, a display, an electronic book, a portable phone and an electronic book reader.

19. A display device comprising:
a signal line to which an analog signal is inputted;
a transistor for driving a light emitting element;
a power source line;
a capacitor line;
a first switch provided between a capacitor and the power source line; and
a second switch provided between the capacitor and the capacitor line,
wherein a current is supplied to the light emitting element from the power source line based on the analog signal and a potential of the power source line,
wherein a current is supplied to the light emitting element from the capacitor line based on the analog signal and a potential of the capacitor line, and
wherein a connection between the transistor and the capacitor line is disconnected by the second switch per predetermined period.

20. The display device according to claim 19, further comprising:
a switching transistor,
wherein one electrode of the switching transistor is connected to the signal line and the other electrode of the switching transistor is connected to a gate electrode of the transistor.

21. The display device according to claim 19, wherein a potential of the power source line is higher than a potential of the capacitor line.

22. The display device according to claim 15, wherein a potential of the power source line is lower than a potential of the capacitor line.

23. The display device according to claim 19, wherein the display device is incorporated into an electronic apparatus selected from the group consisting of a camera such as a digital camera and a video camera, a goggle type display, a navigation system, a mobile computer, a game machine, a display, an electronic book, a portable phone and an electronic book reader.

24. A display device comprising:
a signal line to which an analog signal is inputted;
a capacitor line connected to the signal line through a capacitor;
a transistor for driving a light emitting element;
a power source line;
a first switch provided between the capacitor and the power source line; and
a second switch provided between the capacitor and the capacitor line,
wherein a gate electrode of the transistor is connected to the capacitor and one electrode of the transistor is connected to the power source line.

25. The display device according to claim 24, wherein the other electrode of the transistor is connected to the light emitting element.

26. The display device according to claim 24, further comprising:
a switching transistor,
wherein one electrode of the switching transistor is connected to the signal line and the other electrode of the switching transistor is connected to the gate electrode of the transistor.

27. The display device according to claim 24, wherein a potential of the power source line is higher than a potential of the capacitor line.

28. The display device according to claim 24, wherein a potential of the power source line is lower than a potential of the capacitor line.

29. The display device according to claim 24, wherein the display device is incorporated into an electronic apparatus selected from the group consisting of a camera such as a digital camera and a video camera, a goggle type display, a navigation system, a mobile computer, a game machine, a display, an electronic book, a portable phone and an electronic book reader.

30. A display device comprising:
a signal line to which an analog signal is inputted;
a transistor;
a light emitting element;
a first power source line;
a second power source line;
a capacitor; and
means for selectively connecting one of the first power source line and the second power source line to the light emitting element,
wherein a gate electrode of the transistor is connected to the capacitor.

* * * * *